United States Patent
Sahota et al.

(10) Patent No.: US 12,362,729 B2
(45) Date of Patent: Jul. 15, 2025

(54) ACTIVE FILTERS AND GYRATORS INCLUDING CASCADED INVERTERS

(71) Applicant: QUALCOMM Incorporated, San Diego, CA (US)

(72) Inventors: Gurkanwal Singh Sahota, San Diego, CA (US); Aleksandar Miodrag Tasic, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/400,991

(22) Filed: Aug. 12, 2021

(65) Prior Publication Data

US 2023/0051839 A1    Feb. 16, 2023

(51) Int. Cl.
| | |
|---|---|
| *H03K 5/125* | (2006.01) |
| *H03H 11/08* | (2006.01) |
| *H03K 5/1252* | (2006.01) |
| *H03K 19/20* | (2006.01) |

(52) U.S. Cl.
CPC ........... *H03H 11/08* (2013.01); *H03K 5/1252* (2013.01); *H03K 19/20* (2013.01)

(58) Field of Classification Search
CPC .. H03H 7/0153; H03H 7/0161; H03H 7/0169; H03H 7/12; H03H 11/08; H03K 3/013; H03K 5/01; H03K 5/125; H03K 5/1252; H03K 19/20; H04B 1/0017; H04B 1/0042
See application file for complete search history.

(56) References Cited

U.S. PATENT DOCUMENTS

| | | | | |
|---|---|---|---|---|
| 5,686,861 | A | * | 11/1997 | Shou ....................... H03H 11/04 327/344 |
| 5,751,184 | A | * | 5/1998 | Shou .................. H03H 11/1217 327/558 |
| 7,183,868 | B1 | * | 2/2007 | Wessendorf ......... H03K 3/3545 331/158 |

(Continued)

FOREIGN PATENT DOCUMENTS

| | | |
|---|---|---|
| CN | 202565230 U | 11/2012 |
| CN | 111464058 A | 7/2020 |
| WO | 0141307 A1 | 6/2001 |

OTHER PUBLICATIONS

Partial International Search Report—PCT/US2022/036998—ISA/EPO—Nov. 2, 2022.

(Continued)

*Primary Examiner* — Long Nguyen
(74) *Attorney, Agent, or Firm* — Loza & Loza, LLP/Qualcomm Incorporated

(57) ABSTRACT

An aspect relates to a filter or a first gyrator including a first set of cascaded inverters, and a first set of one or more passive devices coupled to the first set of cascaded inverters. Another aspect relates to a method including applying an input signal to an input of a first one of a set of cascaded inverters coupled to a set of one or more passive devices, and receiving an output signal from the set of cascaded inverters, the output signal being a filtered version of the input signal. Still another aspect relates to a transceiver including a filter with a first set of cascaded inverters, and a first set of one or more passive devices coupled to the first set of cascaded inverters; and a mixer coupled to the filter.

26 Claims, 8 Drawing Sheets

(56) References Cited

U.S. PATENT DOCUMENTS

| | | | |
|---|---|---|---|
| 7,653,353 | B2 | 1/2010 | Huang |
| 7,696,820 | B1 * | 4/2010 | Voo .......................... H03F 1/36 330/99 |
| 8,116,690 | B2 | 2/2012 | Rofougaran et al. |
| 10,802,533 | B2 * | 10/2020 | Wong ........................ G06F 1/10 |
| 2006/0197632 | A1 | 9/2006 | Chang et al. |
| 2014/0266361 | A1 | 9/2014 | Shashidharan et al. |
| 2016/0028406 | A1 * | 1/2016 | Kobayashi ............. H03K 3/011 331/57 |
| 2017/0214391 | A1 | 7/2017 | Hedayati et al. |
| 2019/0229713 | A1 | 7/2019 | Krishna |
| 2019/0341915 | A1 | 11/2019 | Schultz et al. |

OTHER PUBLICATIONS

Pirmohammadi A., et al., "A Low Power Tunable Gm-C Filter based on Double CMOS Inverters in 0.35 [mu]m", Analog Integrated Circuits and Signal Processing, Kluwer Academic Publishers, BO, vol. 71, No. 3, Jul. 21, 2011, pp. 473-479, XP035053638, 2012, 2 Proposed structure, p. 474, left-hand column-p. 475, right-hand column, fig. 1-3, 3 Filter design, p. 475, right-hand column-p. 476, left-hand column, fig. 4, 4 results and discussion, p. 476, right-hand column-p. 477, left-hand column, figs. 8-10.

Ramasamy S., et al., "VLSI Implementation of a Digitally Tunable Gm-C Filter with Double CMOS Pair", 21st International Conference on VLSI Design, 2008, VLSID 2008, IEEE, Piscataway, NJ, USA, Jan. 4, 2008, pp. 317-322, XP031230060, 2. CMOS pair based transconductor, p. 317, right-hand column-p. 319, left-hand column, fig. 1-4, 3. Digitally tunable second order band pass Gm-C filter, p. 319, left-hand column-p. 320, right-hand column, fig. 5-8.

Zanjani S.M.A., et al., "Inverter-based, Low-Power and Low-Voltage, New Mixed-Mode Gm-C Filter in Subthreshold CNTFET Technology", IET Circuits Devices and Systems, The Institution of Engineering and Technology, GB, vol. 12, No. 6, Oct. 29, 2018, 8 Pages, XP006095034, pp. 681-688, ISSN: 1751-858X, DOI: 10.1049/IET-CDS.2018.5158, 3 Proposed filter structure, p. 682, right-hand column-p. 683, right-hand column, figures 2, 3.

Zemouri W., et al., "High Frequency Tow-Thomas Tunable Filter using OTA based Voltage OP-AMP", 2011 13th International Symposium on Integrated Circuits (ISIC), IEEE, Dec. 12, 2011, pp. 484-487, XP032096315, DOI: 10.1109/ISICIR.2011.6132002, ISBN: 978-1-61284-863-1, II. Fully Differential Tow-Thomas Filter, p. 484, right-hand column-p. 485, left-hand column, figures 1, 2, III. Feed-forward compensated op-amp, p. 485, figure 3.

International Search Report and Written Opinion—PCT/US2022/036998—ISA/EPO—Jan. 2, 2023.

* cited by examiner

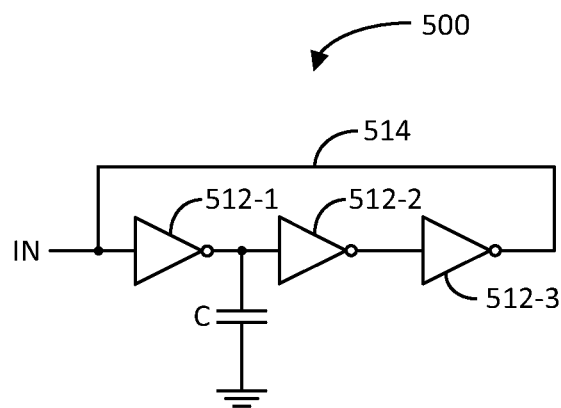 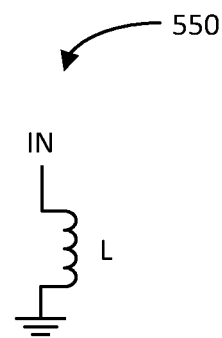
FIG. 5A  FIG. 5B
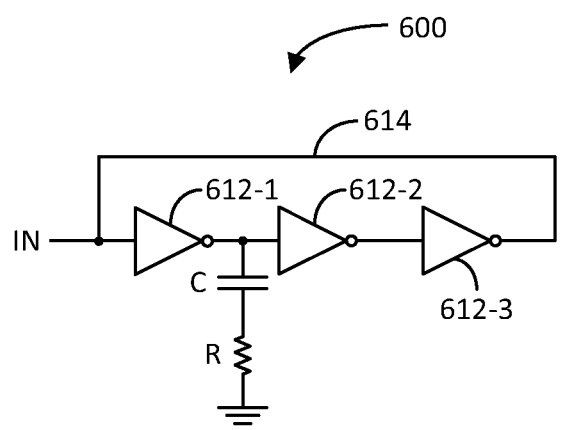 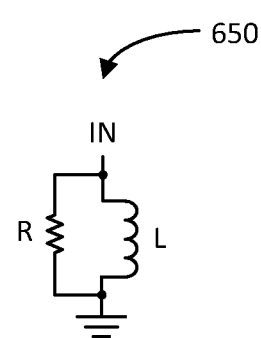
FIG. 6A  FIG. 6B

ACTIVE FILTERS AND GYRATORS INCLUDING CASCADED INVERTERS

FIELD

Aspects of the present disclosure relate generally to filters and gyrators used in device which communicates using wireless signals.

BACKGROUND

Active filters and gyrators in a device which communicates with wireless signals typically employ an operational amplifier coupled to one or more passive devices, such as capacitors, resistors, and inductors. An operational amplifier is typically a complex device. For example, an operational amplifier may include an input pair of differential field effect transistors (FETs), one or more current sources or sinks coupled between the sources of the differential FET pair and ground (or a negative voltage rail), passive and/or active output impedance components, current mirrors for controlling the current through the differential FET pair, common mode voltage controlling circuitry, as well as other circuitry depending on gain and/or other requirements. As such, operational amplifiers typically have a relatively large circuit or integrated circuit (IC) footprint, consume a significant amount of power, and may have relatively narrow bandwidth characteristics.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes a filter or a first gyrator including: a first set of cascaded inverters; and a first set of one or more passive devices coupled to the first set of cascaded inverters.

Another aspect of the disclosure relates to a method. The method includes applying an input signal to an input of a first one of a set of cascaded inverters coupled to a set of one or more passive devices; and receiving an output signal from the set of cascaded inverters, the output signal being a filtered version of the input signal.

Another aspect of the disclosure relates to a transceiver. The transceiver includes a filter including a first set of cascaded inverters, and a first set of one or more passive devices coupled to the first set of cascaded inverters; and a mixer coupled to the filter.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

BRIEF DESCRIPTION OF THE DRAWINGS

FIG. 5A-5B illustrate schematic diagrams of an example gyrator with a set of cascaded inverters and a corresponding example shunt inductor in accordance with another aspect of the disclosure, respectively.

FIG. 6A-6B illustrate schematic diagrams of another example gyrator with a set of cascaded inverters and a corresponding example shunt inductor-resistor in accordance with another aspect of the disclosure, respectively.

DETAILED DESCRIPTION

Figure 1A:
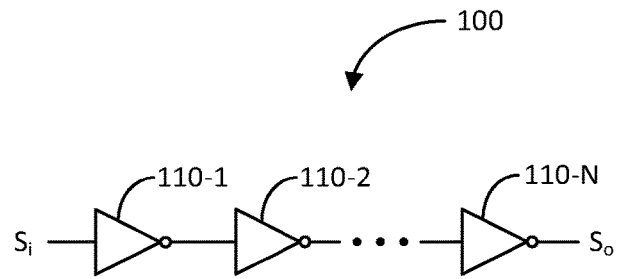
FIG. 1A-1B illustrate schematic diagrams of an example set of cascaded inverters and a corresponding example operational amplifier in accordance with an aspect of the disclosure, respectively.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Baseband (BB) filters are typically employed at the outputs of mixers in receivers. A mixer receives a radio frequency (RF) signal that has been previously received by at least one antenna (e.g., an antenna array) and amplified by a low noise amplifier (LNA). The mixer mixes the RF signal with a local oscillator (LO) signal to generate a mixed signal. The mixed signal includes a received signal-of-interest ("target received signal) and unwanted signals. For example, the unwanted signals may be an upper frequency component of the mixed signal, external interference signals (sometimes referred to as RF jammers or blockers) that lie near or within a passband of the target received signal, or leakage of transmit signals from an associated transmitter that lies near or within a passband of the target received signal, for example. The mixer may downconvert the RF signal to a signal at (or near) baseband, or may downconvert the RF signal to an intermediate frequency (IF) signal and an additional mixer may downconvert the IF signal to a signal at (or near) baseband.

A combination of a baseband (BB) filter and an analog-to-digital converter (ADC) followed by an anti-aliasing filter have been used to substantially filter out the unwanted signals in a receiver. The BB filter removes some of the unwanted signals. The ADC, which is typically operated at a sampling rate significantly higher than the Nyquist rate to provide significant frequency spacing between image signals, and the anti-aliasing filter may be able to filter most of the images and unwanted signals from the frequency band of the target received signal. However, the high sampling rate results in the ADC consuming significant power to spread the image signals in frequency to allow the BB filter and anti-aliasing filter to effectively eliminate the unwanted signals.

FIN field effect transistors (FINFETs), especially on a scale of 14 nanometers (nm) or below, may provide efficient transconductance gain ($g_m$) that can be used in filters and gyrators. More specifically, a set of cascaded inverters, implemented using FINFETs and tightly controlled by complementary metal oxide semiconductor (CMOS) processes, may provide sufficient wideband transconductance gain ($g_m$) for use in filters and gyrators. In some examples, the FINFETs or transistors of inverters may be biased near their transition regions of their voltage-transfer characteristic (VTC) and the output voltage of an inverter may substantially be a linear function of its input voltage.

Certain examples of inverters will be discussed below. Inverters other than those illustrated and/or described (and/or using process technologies and/or nodes other than those explicitly recited), however, may be implemented. For example, active load, passive-load, and/or tuned-load inverters may be used. In some examples, biasing may be used to stabilize one or more of the inventers. For example, bias may be used with a DC feedback loop to stabilize operation of at least one of the inverters. Biasing may cause the in-to-out gain to be limited and stay in well controlled region in some examples. Further, cascading inverters may allow for overall gain to be increased to a desired value or range. In some examples, coupling a resistor between an output of one stage and an input of another stage (e.g., between an output of an inverter forming an output of a gyrator-equivalent circuit, as will be described below, and in input of an invert forming an input of the gyrator-equivalent circuit) may stabilize a DC node of the output inverter. In some examples, a circuit as described with respect to FIG. 9 may be used to control gain of an inverter, for example such that a transconductance gain ($g_m$) of the inverter is inversely proportional to resistance associated therewith (as will be described in more detail below). Further, other biasing schemes and/or loops (e.g., DC feedback loops) may be used.

Accordingly, operational amplifiers that are typically used in active filters and gyrators may be replaced with a set of cascaded inverters to achieve a desired filter frequency response as provided by filters or impedance inversion as provided by gyrators, as discussed in more detail herein. Filters may also employ gyrators to implement their filtering operation.

Although the filter (as well as the gyrator) examples discussed above have been described with reference to (baseband) receiver applications, it shall be understood that filters and gyrators described herein may be used in other applications, including transmitter applications.

FIG. 1A illustrates a schematic diagram of an example set of cascaded inverters 100 in accordance with an aspect of the disclosure. The set of cascaded inverters 100 may include an input inverter 110-1 configured to receive an input signal $S_i$, which may be a down converting mixer output signal in the case of a receiver application or an input signal for an up converting mixer in the case of a transmitter application. The set of cascaded inverters 100 may further include one or more intermediate inverters 110-2 to 110-N-1 between the input inverter 110-1 and an output inverter 110-N. It shall be understood that the set of cascaded inverters 100 need not include an intermediate inverter, as in the case of a pair of cascaded inverters. In such embodiments, the set of cascaded inverters 100 includes two inverters. In other embodiments, the set of cascaded inverters 100 includes three inverters, as illustrated, or more than three inverters. As shown, the inverters are coupled in series, with the output of the input inverter 110-1 being coupled to an input of the next inverter, and the output of the next inverter being coupled to an input of a following inverter, and so on up to the output inverter 110-N.

As discussed further herein, for filtering and/or gyrator applications, one or more other passive components (which may include, for example, one or more reactance and/or other passive components) may be coupled to the set of cascaded inverters 100. In this regard, the output inverter 110-N may be configured to produce an output signal $S_o$, which may be a filtered version of the input signal $S_i$, based on the application in which the set of cascaded inverters 100 are employed. For example, to implement a Rauch filter, the filter may include at least one feedback capacitor and at least one resistor coupled to the set of cascaded inverters 100. To implement a Tow-Thomas biquad filter, the filter may include multiple sets of cascaded inverters, each set of cascaded inverters including at least one feedback capacitor, at least one feedback resistor, or both. To implement a Sallen-Key filter, the filter may include at least one capacitor and at least one resistor coupled to the set of cascaded inverters. To implement a gyrator, the gyrator may include at least one capacitor and/or at least one resistor coupled to the set of cascaded inverters. The set of cascaded inverters may be used to implement more complex filters, which may be used in receiver and/or transmitter applications.

Figure 1B:
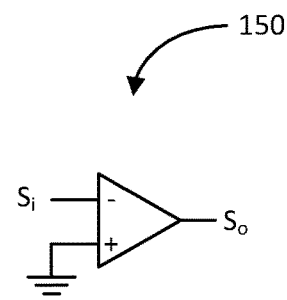

FIG. 1B illustrates a schematic diagram of an example operational amplifier 150 in accordance with another aspect of the disclosure. The operational amplifier 150 may be used in filter and gyrator applications. As an example, an input signal $S_i$ may be applied to a first input terminal (e.g., a negative input terminal as shown, or a positive input terminal) of the operational amplifier 150. The operational amplifier 150 includes a second input terminal (e.g., a positive input terminal as shown, or a negative input terminal), which is often coupled to a voltage rail, such as ground (or a particular reference voltage) in many filter applications. As with the set of cascaded inverters 100, one or more additional components may be coupled to the operational amplifier 150 to implement a particular filter or gyrator application.

In filtering and gyrator applications, the operational amplifier 150 may serve as a transconductance gain ($g_m$) component of the active filter or gyrator application. In this regard, the operational amplifier 150 includes an output terminal configured to produce an output signal $S_o$, which may be a filtered version of the input signal $S_i$. As discussed below in more detail, the set of cascaded inverters 100 may also serve as a transconductance gain ($g_m$) component of an active filter or gyrator application. Thus, the set of cascaded inverters 100 may be implemented in a filter or gyrator application in place of the operational amplifier 150. There are several advantages of using the set of cascaded inverters 100 over the operational amplifier 150 in filtering or gyrator applications.

As previously discussed, the operational amplifier 150 is typically a complex circuit at the transistor-level. For example, the operational amplifier 150 may include a differential FET pair, one or more current sources or sinks coupled between the sources of the differential FET pair and ground (or a negative voltage rail), passive and/or active output impedance components, a current mirror for controlling the current through the differential FET pair, and/or common mode voltage controlling circuitry, as well as other circuitry depending on gain and/or other requirements. In contrast, the set of cascaded inverters may be a set of CMOS FINFETs, which may be significantly less complex, requires less circuit or integrated circuit (IC) footprint, consumes significantly less power, and may have wider bandwidth characteristics. In some embodiments, the set of cascaded inverters may be single-ended, having both a single-ended input and a single-ended output, with single ended signals being conveyed between inverters in the set. In some embodiments, a supply coupled to the inverters may be lower than a supply required by the operational amplifier. In some embodiments, a supply coupled to the inverters is approximately 0.8V. The following describes several filter and gyrator applications that use a set of cascaded inverters as the transconductance ($g_m$) component of the filter and gyrator applications.

Figure 2A:
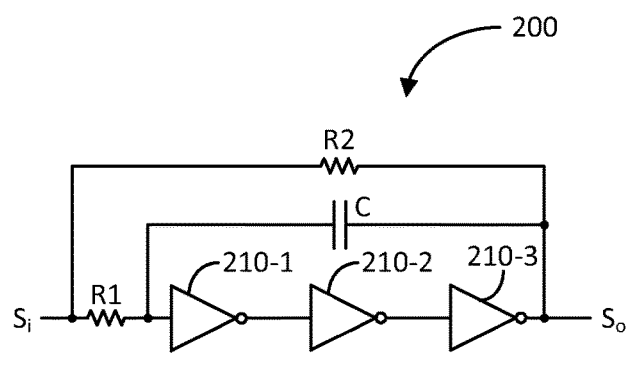
FIG. 2A-2B illustrate schematic diagrams of an example Rauch filter with a set of cascaded inverters and a corresponding example Rauch filter with an operational amplifier in accordance with another aspect of the disclosure, respectively.

FIG. 2A illustrates a schematic diagram of an example Rauch filter 200 in accordance with another aspect of the disclosure. A Rauch filter may be a low pass filter that has a characteristic of being less sensitive to component variation as compared to other filters. A Rauch filter may include one zero and complex poles to provide a steeper roll-off as compared to a single-pole filter.

In this example, the Rauch filter 200 includes a set of cascaded inverters 210-1 to 210-3 (e.g., three (3), in this example, but could be configured with other numbers of cascaded inverters). The Rauch filter 200 further includes a first resistor R1 coupled between an input (node) of the Rauch filter 200 (at which an input signal $S_i$ may be received) and an input of the first cascaded inverter 210-1 of the set. The Rauch filter 200 may further include a feedback capacitor C connected between an output of the last cascaded inverter 210-3 of the set and the input of the first cascaded inverter 210-1. Additionally, the Rauch filter 200 may include a feedback resistor R2 connected between the output of the last cascaded inverter 210-3 and the input (node) of the Rauch filter 200. Thus, a first terminal of the first resistor R1 may be directly connected to feedback resistor R2 (and the input of the Rauch filter 200) and a second terminal of the first resistor R1 may be directly connected to the feedback capacitor C (and to the input of the first cascaded inverter 210-1).

The output of the last inverter 210-3 is configured to produce an output signal $S_o$, which is a filtered version of the input signal $S_i$ in accordance with the filter frequency response of the Rauch filter 200. The filter frequency response of the Rauch filter 200 depends on the resistances of the input and feedback resistors R1 and R2, and the capacitance of the feedback capacitor C. The Rauch filter 200 may also serve as a transimpedance amplifier (TIA). In such case, the input signal $S_i$ may be an input current, and the output signal $S_o$ may be an output voltage. Additionally, in this example, the number of cascaded inverters in the set is three (3), which is odd (which may also be characterized as the number of cascaded inverters between the first one and the last one also being odd). In such case, the feedback provided by the feedback capacitor C and the feedback resistor R2 is a negative feedback due to the cascaded inversion operation.

Figure 2B:
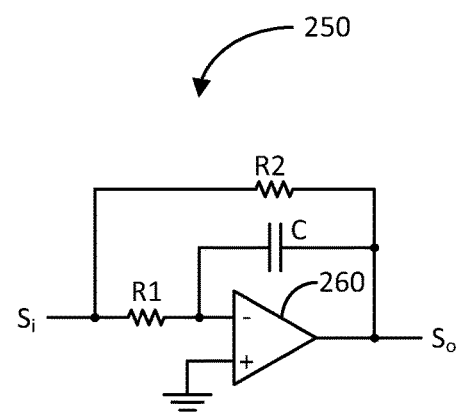

FIG. 2B illustrates a schematic diagram of an example Rauch filter 250 in accordance with another aspect of the disclosure. In this example, the Rauch filter 250 is implemented with an operational amplifier 260. The Rauch filter 250 includes an input resistor R1 connected between an input (node) of the Rauch filter 250 (where an input signal $S_i$ is received) and a negative input terminal of the operational amplifier 260. The Rauch filter 250 includes a feedback capacitor C connected between an output and the negative input of the operational amplifier 260. Additionally, the Rauch filter 250 further includes a feedback resistor R2 connected between an output of the operational amplifier 260 and the input (node) of the Rauch filter 250. Although the resistors R1 and R2 and capacitor C are identified the same in both filters 200 and 250, it shall be understood that the resistances of the resistors R1 and R2 and capacitance of the capacitor C may be different in both filters 200 and 250. This shall apply to all other comparisons of an inverter-based filter to an operational amplifier-based filter, as described further herein. As discussed, the set of cascaded inverters 210-1 to 210-3 may be significantly less complex, requiring less circuitry or IC footprint, may consume significantly less power, and may have wider bandwidth characteristics than the operational amplifier 260.

Figure 3A:
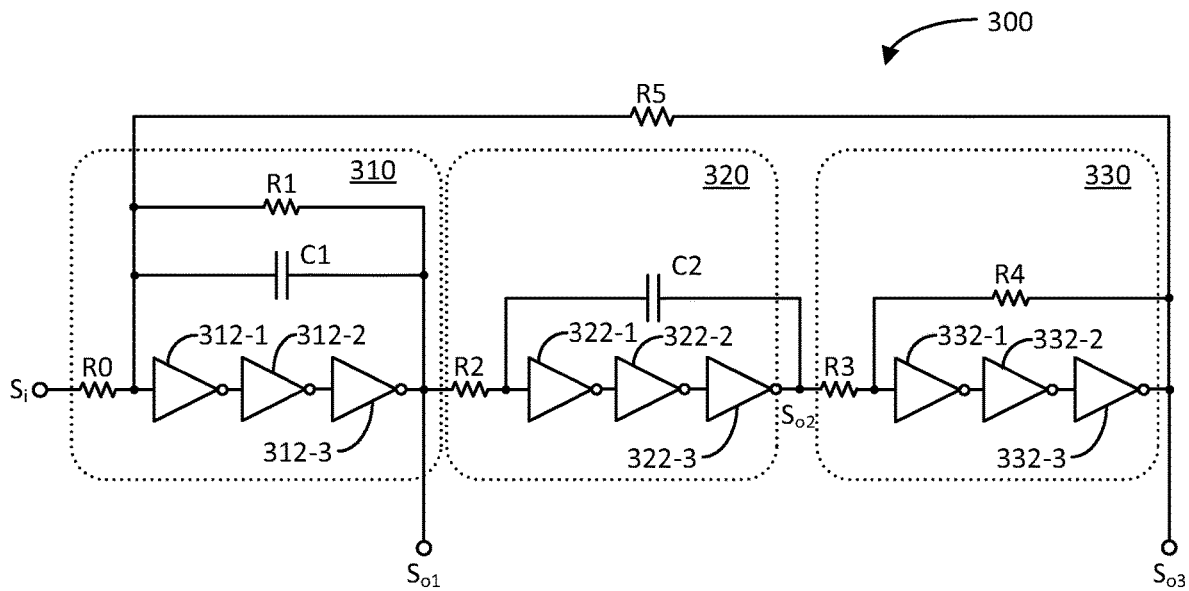
FIG. 3A-3B illustrate schematic diagrams of an example Tow-Thomas biquad filter with sets of cascaded inverters and a corresponding example Tow-Thomas biquad filter with operational amplifiers in accordance with another aspect of the disclosure, respectively.

FIG. 3A illustrates a schematic diagram of an example Tow-Thomas biquad filter 300 in accordance with another aspect of the disclosure. The Tow-Thomas biquad filter 300 can be configured as a low pass filter (LPF) and/or a band pass filter (BPF). The Tow-Thomas biquad filter 300 may include a first output configured to generate a first output signal related to an input signal being band pass filtered, and a second output configured to generate a second output signal related to the input signal being low pass filtered.

More specifically, the Tow-Thomas biquad filter 300 includes a first filter stage 310 including an input resistor R0, a first set of cascaded inverters 312-1 to 312-3, a feedback capacitor C1 and a feedback resistor R1, both coupled in parallel between an output of the last cascaded inverter 312-3 and an input of the first cascaded inverter 312-1. The input resistor R0 is coupled between an input of the Tow-Thomas biquad filter 300 (where an input signal $S_i$ is received) and the input of the first cascaded inverter 312-1. The output of the last cascaded inverter 312-3 is configured to produce a first output signal $S_{o1}$, which may be related to the input signal $S_i$ being filtered by the first filter stage 310. The first filter stage 310 may be configured to apply a band pass filter (BPF) frequency response to the input signal $S_i$ based on the resistances and capacitance of the resistors R0 and R1 and capacitor C1 to generate the first output signal $S_{o1}$.

In this example, the Tow-Thomas biquad filter 300 includes a second filter stage 320 including an input resistor R2, a second set of cascaded inverters 322-1 to 322-3, and a feedback capacitor C2. The input resistor R2 is coupled between the output of the first filter stage 310 and an input of the first cascaded inverter 322-1 of the second filter stage 320. Accordingly, the second filter stage 320 is configured to receive at its input the output signal $S_i$ from the first filter stage 310. The feedback capacitor C2 is connected between an output of the last cascaded inverter 322-3 and the input of the first cascaded inverter 322-1. The second filter stage 320 is configured to filter the output signal $S_{o1}$ of the first filter stage 310 in accordance with the resistance and capacitance of the input resistor R2 and feedback capacitor C2 to generate an intermediate signal or a second output signal $S_{o2}$. In other words, the signal $S_{o2}$ may be applied to another device external to the Tow-Thomas biquad filter 300, in which case, it is a second output signal; or, the signal $S_{o2}$ may be not be applied to another device, in which case, it just serves as an intermediate signal of the Tow-Thomas biquad filter 300.

Further, in accordance with this example, the Tow-Thomas biquad filter 300 includes a third filter stage 330 including an input resistor R3, a third set of cascaded inverters 332-1 to 332-3, and a feedback resistor R4. The input resistor R3 is coupled between the output of the second filter stage 320 and an input of the first cascaded inverter 332-1 of the third filter stage 330. Accordingly, the third filter stage 330 is configured to receive at its input the output signal $S_{o2}$ from the second filter stage 320. The feedback resistor R4 is connected between an output of the last cascaded inverter 332-3 and the input of the first cascaded inverter 332-1. The third filter stage 330 is configured to filter the output signal $S_{o2}$ of the second filter stage 320 in accordance with the resistances of the input resistor R3 and the feedback resistor R4 to generate a second or third output signal $S_{o3}$. The cascaded filter stages 310, 320, and 330 may be configured to apply a low pass filter (LPF) frequency response to the input signal $S_i$ based on the resistances of resistors R0 to R4 and capacitances of capacitors C1-C2 to generate the second and/or third output signal $S_{o3}$. A feedback resistor R5 is connected between the output of the last cascaded inverter 332-3 and the input of the first cascaded inverter 312-1 of the Tow-Thomas biquad filter 300.

Figure 3B:
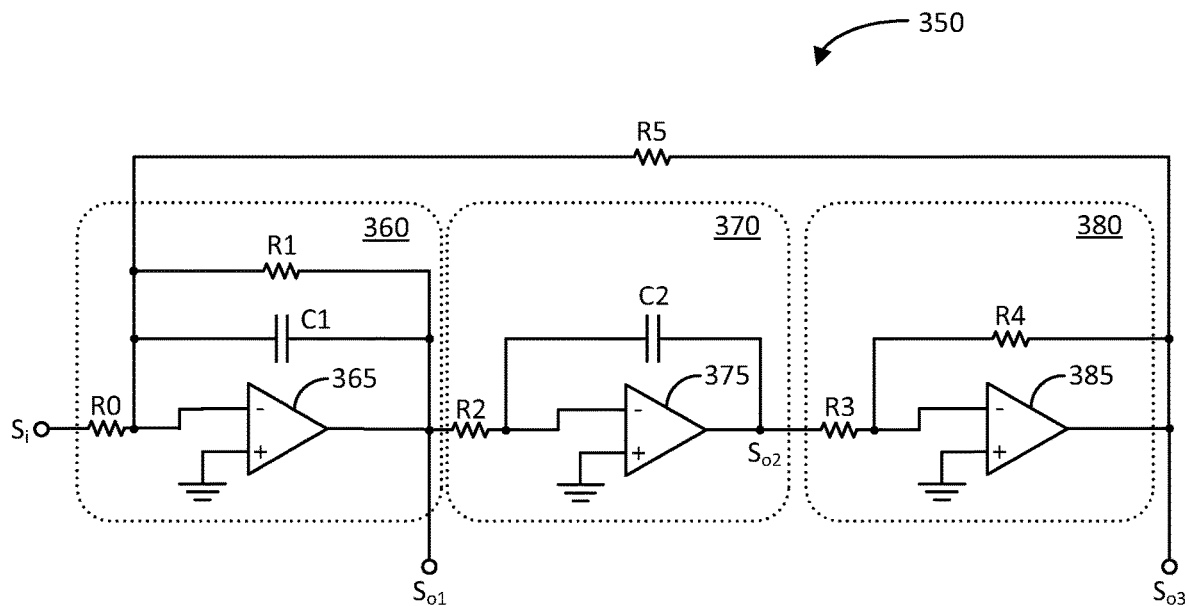

FIG. 3B illustrates a schematic diagram of an example Tow-Thomas biquad filter 350 in accordance with another aspect of the disclosure. In this example, the Tow-Thomas biquad filter 350 includes three (3) cascaded filter stages 360, 370, and 380 including operational amplifiers 365, 375, and 385 with resistors R0-R5 and capacitors C1-C2 as shown. As discussed, the first, second, and third sets of cascaded inverters 312-1 to 312-3, 322-1 to 322-3, and 332-1 to 332-3 may be significantly less complex, requiring less circuitry or IC footprint, may consume significantly less power, and may have wider bandwidth characteristics than the three (3) operational amplifiers 365, 375, and 385 of the Tow-Thomas biquad filter 350.

Figure 4A:
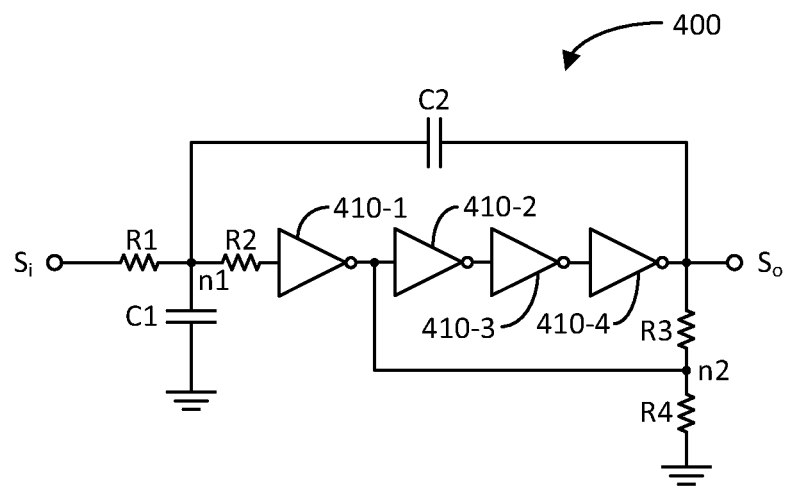
FIG. 4A-4B illustrate schematic diagrams of an example Sallen-Key filter with a set of cascaded inverters and a corresponding example Sallen-Key filter with an operational amplifier in accordance with another aspect of the disclosure, respectively.

FIG. 4A illustrates a schematic diagram of an example Sallen-Key filter 400 in accordance with another aspect of the disclosure. The Sallen-Key filter 400 may be used to implement a second-order active filter operation. In particular, the Sallen-Key filter 400 includes a first input resistor R1, a second input resistor R2, an input capacitor C1, a set of cascaded inverters 410-1 to 410-4, a feedback capacitor C2, and a voltage divider including resistors R3 and R4. The first and second resistors R1-R2 are coupled in series between an input (node) of the Sallen-Key filter 400 (at which an input signal $S_i$ is received) and an input of the first cascaded inverter 410-1 of the set. The input capacitor C1 may be connected between a node n1 (between resistors R1 and R2) and a voltage rail (e.g., ground). The feedback capacitor C2 is connected between an output of last cascaded inverter 410-4 of the set and node n1. The resistors R3 and R4 are connected in series between the output of the last cascaded inverter 410-4 and the voltage rail (e.g., ground). A node n2 between the resistors R3 and R4 is coupled to an output of the first inverter 410-1 of the set.

The output of the last cascaded inverter 410-4 is configured to generate an output signal $S_o$, which is related to the input signal $S_i$ being filtered in accordance with the filter frequency response of the Sallen-Key filter 400, which depends on the resistances of resistors R1-R4 and capacitances of capacitors C1 and C2. As the Sallen-Key filter 400 involves a positive feedback via capacitor C2, the number of cascaded inverters in the set is four (4), but could be another even number (which may also be characterized as the number of cascaded inverters between the first one and the last one also being even or zero (0)). For stability purposes, the coupling of node n2 to the output of the first cascaded inverter 410-1 involves a negative feedback as it spans across an odd number (e.g., three (3)) of the cascaded inverters 410-2 to 410-4.

In some aspects, a set of cascaded inverters includes a configuration in which two inverters in the set are directly connected together, and no other elements are connected therebetween or connected to a node therebetween. For example, such configuration is illustrated in FIG. 4A, in which an output of the inverter 410-2 is directly connected to an input of the inverter 410-3. No other elements are connected between the inverter 410-2 and 410-3, nor are any other elements connected to the node or connection between these inverters. In contrast, the node between the inverter 410-1 and 410-2 is connected to other elements (e.g., the resistors R3 and R4).

Figure 4B:
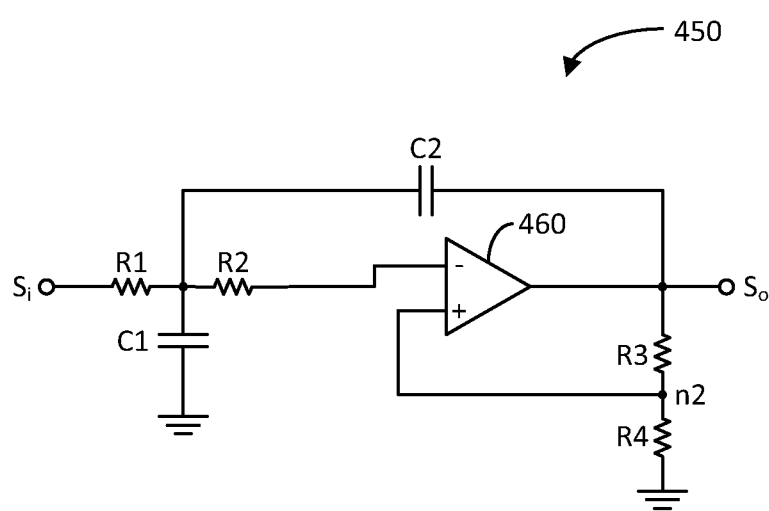

FIG. 4B illustrates a schematic diagram of an example Sallen-Key filter 450 in accordance with another aspect of the disclosure. In this example, the Sallen-Key filter 450 includes an operational amplifier 460 including input resistors R1 and R2, input capacitor C1, feedback capacitor C2, and voltage divider including resistors R3 and R4 as shown in FIG. 4B. As discussed, the set of cascaded inverters 410-1 to 410-4 may be significantly less complex, requiring less circuitry or IC footprint, may consume significantly less power, and may have wider bandwidth characteristics than the operational amplifier 460 of the Sallen-Key filter 450.

FIG. 5A illustrates a schematic diagram of an example gyrator 500 in accordance with another aspect of the disclosure. A gyrator may be used to inverse an impedance of one or more passive devices. For example, a gyrator may be used to invert an impedance of a capacitor to produce an impedance of an inductor. Conversely, a gyrator may be used to invert an impedance of an inductor to produce an impedance of a capacitor. In this example, the gyrator 500 is configured to invert an impedance more generally of a capacitor to generate an impedance more generally of an inductor. As inductors are generally more difficult to implement in ICs and/or consume additional space, the gyrator 500 may be used in filters to implement inductors as needed to achieve desired frequency responses of the filters.

The gyrator 500 includes a set of cascaded inverters 512-1 to 512-3, a shunt capacitor C, and an electrically-conductive feedback path 514 (e.g., substantially zero (0) or negligible resistance) connecting the output of the last cascaded inverter 512-3 to an input of the first cascaded inverter 512-1. The capacitor C is connected between an output of the first cascaded inverter 512-1 and a voltage rail (e.g., ground). A signal may be applied to an input of the gyrator 500, e.g., at the input of the first cascaded inverter 512-1. Due to impedance inversion, the input sees an impedance of a shunt inductor L 550, as depicted in FIG. 5B.

FIG. 6A illustrates a schematic diagram of another example gyrator 600 in accordance with another aspect of the disclosure. The gyrator 600 may be configured to implement an impedance of a resistive-loaded inductor. As discussed further herein, an inductor in series with a capacitor between a signal node and a voltage rail (e.g., ground) may be used to generate a relatively narrow frequency notch in a filter frequency response. A resistive-loaded inductor in series with a capacitor between a signal node and a voltage rail (e.g., ground) may be used to generate a wider frequency notch in a filter frequency response, where the width is related to a resistance of the resistor.

The gyrator 600 includes a set of cascaded inverters 612-1 to 612-3, a capacitor C, a resistor R, and an electrically-conductive feedback path 614 (e.g., substantially zero (0) or negligible resistance) connecting the output of the last cascaded inverter 612-3 to an input of the first cascaded inverter 612-1. The capacitor C and the resistor are coupled in series between an output of the first cascaded inverter 612-1 and a voltage rail (e.g., ground). A signal may be applied to an input of the gyrator 600, e.g., at the input of the first cascaded inverter 612-1. Due to the impedance inversion, the input sees an impedance of a resistive-loaded shunt inductor L 650, as depicted in FIG. 6B.

Figure 7A:
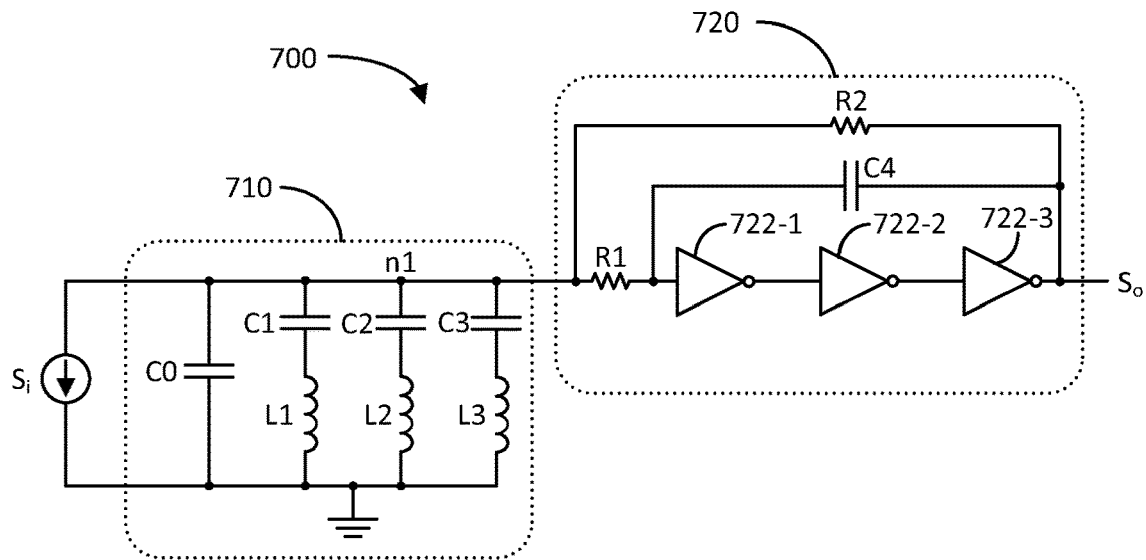
FIG. 7A-7B illustrate schematic diagrams of an example baseband filter with sets of cascaded inverters and alternative details of inductors of the baseband filter in accordance with another aspect of the disclosure.

FIG. 7A illustrates a schematic diagram of an example filter 700 in accordance with another aspect of the disclosure. The filter 700 may be used in baseband (BB) filtering or in other applications. The filter 700 includes a first filter stage 710 cascaded with a second filter stage 720. An input signal $S_i$, which may be an input current, is applied to an input of the first filter stage 710. As discussed in more detail herein, the first filter stage 710 performs a specific filtering operation on the input signal $S_i$. The second filter stage 720 may be configured as a Rauch filter (as previously discussed with reference to FIG. 2A) to low pass filter (LPF) the filtered input signal $S_i$ to generate an output signal $S_o$. The second filter stage 720 may be configured as a transimpedance amplifier (TIA) to convert the input current signal $S_i$ into the output voltage signal $S_o$. In other embodiments, multiple filter stages having a current input and voltage output may be coupled together via a resistor to convert the voltage output from one stage into a current for input to a subsequent stage.

The first filter stage 710 includes a shunt capacitor C0 coupled in parallel with an input signal current source $S_i$ (representing the source of the input signal $S_i$) between node n1 and a voltage rail (e.g., ground), a first resonator including a first capacitor C1 coupled in series with a first gyrator L1 (providing an inductive impedance) between node n1 and the voltage rail (e.g., ground), a second resonator including a second capacitor C2 coupled in series with a second gyrator L2 (providing an inductive impedance) between node n1 and the voltage rail (e.g., ground), and a third resonator including a third capacitor C1 coupled in series with a third gyrator L3 (providing an inductive impedance) between node n1 and the voltage rail (e.g., ground). The first filter stage 710 includes a frequency response with three notches dictated by the capacitances and inductances of C1-L1, C2-L2, and C3-L3.

The second filter stage 720 includes an input resistor R1, a set of cascaded inverters 722-1 to 722-3 (e.g., three (3) in this example, but could be configured with a different number of cascaded inverters, as previously discussed), a feedback capacitor C4, and a feedback resistor R2. The first resistor R1 is connected between an output (node n1) of the first filter stage 710 and an input of the first cascaded inverter 722-1 of the set. The feedback capacitor C4 is connected between an output of the last cascaded inverter 722-3 of the set and the input of the first cascaded inverter 722-1. The feedback resistor R2 is connected between the output of the last cascaded inverter 722-3 and the output (node n1) of the first filter stage 710.

The output of the last inverter 722-3 is configured to produce an output signal $S_o$, which is a filtered version of the input signal $S_i$ in accordance with the filter frequency response of the cascaded first and second filter stages 710 and 720. For baseband filtering or other applications, the filter frequency response of the second filter stage 720 may provide a low pass filter that includes a zero (0) at substantially an edge of a passband of a signal-of-interest, and the poles to provide a roll-off above in frequency of the zero (0) to reject unwanted signals. The resistances of resistors R1-R2 and capacitance of capacitor C4 may be set to achieve the desired filter frequency response of the second filter stage 720.

As discussed, the first filter stage 710 may be configured to provide frequency notches at frequencies at which jammers/blockers and transmitter (Tx) leakage into a receiver may occur. For example, such jammers/blockers and Tx leakage may be situated in the roll-off portion of the filter frequency response of the second filter stage 720. If higher rejection of these jammers/blockers and Tx leakage is desired, the notches of the first filter stage 710 may be positioned at the frequencies or expected frequencies of these jammers/blockers and Tx leakage. Thus, the rejection of these jammers/blockers and Tx leakage would be the cumulative rejection provided by the roll-off of the frequency response of the second filter stage 720 and the corresponding notches of the frequency response of the first frequency stage 710. It will be understood that while three notches (e.g., corresponding to the capacitances and inductances of C1-L1, C2-L2, and C3-L3, respectively) are illustrated in FIG. 7A, a greater (e.g., four or more) or fewer (zero to two) number of notches may be implemented in the filter 700. In some embodiments, multiple notch filters in series in the signal path (e.g., as illustrated in FIG. 7A) may be used to implement a stopband.

Figure 7B:
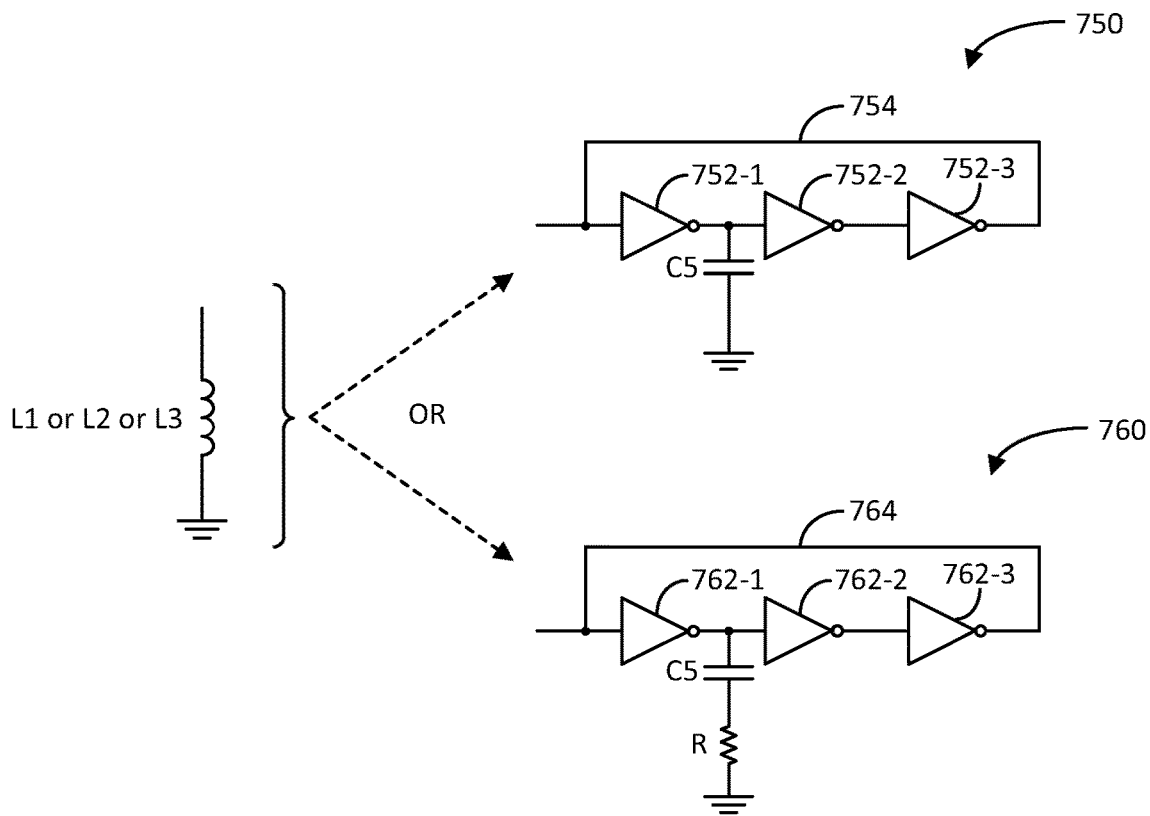

FIG. 7B illustrates schematic diagrams of two gyrators 750 and 760, wherein each may replace any of the inductors L1, L2, and L3 of the first filter stage 710 in accordance with another aspect of the disclosure.

The gyrator 750 includes a set of cascaded inverters 752-1 to 752-3, a capacitor C5 connected between an output of the first cascaded inverter 752-1 and a voltage rail (e.g., ground), and an electrically-conductive feedback path 754 coupling the output of the last cascaded inverter 752-3 to the input of the first cascaded inverter 752-1. The gyrator 750, serving as an inductive element, may be configured in conjunction with a series capacitor (e.g., C1, C2 or C3 of the first filter stage 710) to produce a higher-Q or relatively narrow frequency notch as there is substantially no resistive loading of the capacitor C5.

The gyrator 760 includes a set of cascaded inverters 762-1 to 762-3, a capacitor C5 coupled in series with a resistor R between an output of the first cascaded inverter 762-1 and a voltage rail (e.g., ground), and an electrically-conductive feedback path 764 coupling the output of the last cascaded inverter 762-3 to the input of the first cascaded inverter 762-1. The gyrator 760, serving as an inductive element, may be configured in conjunction with a series capacitor (e.g., C1, C2 or C3 of the first filter stage 710) to produce a lower-Q or relatively wider frequency notch as the resistor R loads the capacitor C5. The frequency width of the notch may be controlled by the resistance of the resistor R.

In some embodiments, each of the inverters 752 or 762 is identical to one another. In some embodiments, each of the inverters 722 is identical to one another. In some embodiments, each of the inverters 752 or 762 is composed of transistors that are configured similar to transistors in each of the inverters 722. For example, each of the inverters 752 or 762 may include a PMOS transistor coupled to an NMOS transistor, and each of the inverters 722 may include a PMOS transistor coupled to an NMOS transistor; all of the PMOS transistors in the inverters 752 or 762 and 722 may be the same size and have the same layout, and all of the NMOS transistors in the inverters 752 or 762 and 722 may be the same size and have the same layout.

As can be seen in FIGS. 7A and 7B, (baseband) filters as described herein may be implemented using only inverters, capacitors, and resistors. For example, such filters may be implemented without an operational amplifier (and certain of the elements, such as a current source, thereof) and/or an inductor.

Figure 8:
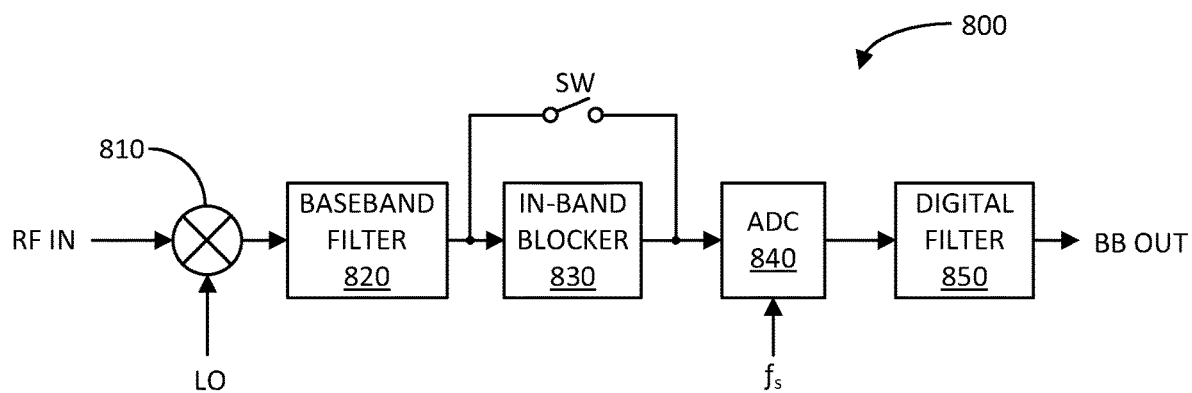
FIG. 8 illustrates a block diagram of an example receiver in accordance with another aspect of the disclosure.

FIG. 8 illustrates a block diagram of an example receiver 800 in accordance with another aspect of the disclosure. The receiver 800 may be an example of an application of one of the aforementioned filters previously discussed. The receiver 800 includes a mixer 810, a baseband (BB) filter 820, an in-band blocker 830, a bypass switching device SW, an analog-to-digital converter (ADC) 840, and a digital filter 850.

The mixer 810 includes a first input configured to receive an RF signal and a second input configured to receive a local oscillator (LO) signal. The mixer 810 includes an output to provide a mixed signal. The baseband (BB) filter 820, which may be configured per filter 700 or any other filter previously discussed, is configured to substantially remove unwanted signals from the mixed signal generated by the mixer 810, including upper frequency components, out-of-band jammers/blockers, transmit signal leakage, etc. In some embodiments, the receiver 800 comprises a cellular receiver and the filter 820 is configured to remove unwanted signals so as to improve co-existence with a WiFi system or sub-system included in a device in which the receiver 800 is implemented. As previously discussed, the two-pole frequency response of the filter 820 including the notches carefully positioned in frequency to coincide with out-of-band jammers/blockers and transmit signal leakage may result in substantially removing unwanted signals from the mixed signal at the output of the mixer 810.

The in-band blocker 830 may perform additional filtering to reduce unwanted signals that may lie within the passband of the received signal-of-interest. The in-band blocker 830 may be selectively bypassed with the bypass switching device SW coupled in parallel with the in-band blocker 830. The ADC 840 converts the filtered signal at the output of the baseband filter 820 (if the bypass switching device SW is closed) or the output of the in-band blocker 830 (if the bypass switching device SW is open) into a digital signal based on a sampling rate $f_s$. As the baseband filter 820 (e.g., configured per filter 700 previously discussed) may substantially reject out-of-band unwanted signals, the requirements of the sampling rate $f_s$ may be relaxed, and good isolation may be maintained at this frequency (for example when the filter 820 is configured as single-ended and not as pseudo-differential, as may be required in configurations including an operational amplifier). Further, such operation of the baseband filter 820 may allow for a larger RX input signal in the presence of jammers, for example due to a reduced need to attenuate such input signal in view of the jammers and a dynamic range of the ADC 840. This may result in better SNR under blocking and/or use of adjacent channel scenarios. The digital filter 850 can further remove high frequency noise and interference from the digital signal generated by the ADC 840 to generate an output baseband (BB) signal.

Figure 9:
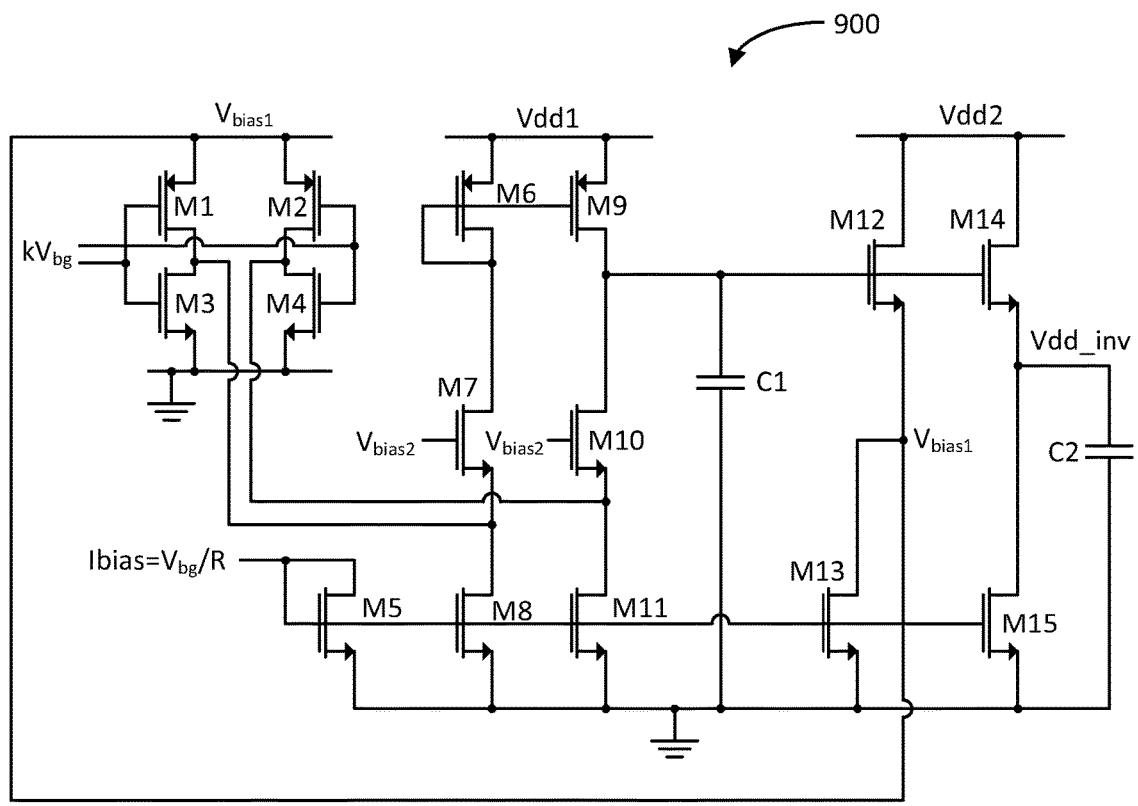
FIG. 9 illustrates a schematic diagram of an example supply voltage generator for a set of cascaded inverters in accordance with another aspect of the disclosure.
Figure 9:
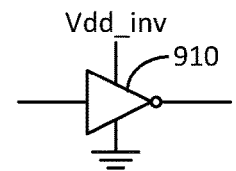

FIG. 9 illustrates a schematic diagram of an example bias voltage generator 900 configured to generate a supply voltage Vdd_inv for a set of cascaded inverters as discussed above in accordance with another aspect of the disclosure. An example inverter 910, which may be an example of any inverter illustrated in and/or described with respect to FIGS. 1A-7B, is depicted receiving the supply voltage Vdd_inv from the bias voltage generator 900. The bias voltage generator 900 is configured to generate the supply voltage Vdd_inv to compensate for variation in resistance of one or more resistors present in the aforementioned filters. In particular, the bias voltage generator 900 may vary the supply voltage Vdd_inv to vary the transconductance gain ($g_m$) of the cascaded inverters inversely proportional to the resistance of the one or more resistors present in a filter. Thus, the variation of the transconductance gain (gm) of the cascaded inverters compensate for variation in the resistance of the resistor(s) in the aforementioned filters with process and/or temperature.

More specifically, the bias voltage generator 900 includes a p-channel metal oxide semiconductor field effect transistor (PMOS FET) M1 and an n-channel metal oxide semiconductor field effect transistor (NMOS FET) M3 coupled in series between a bias voltage rail $V_{bias1}$ and a lower voltage rail (e.g., ground). The PMOS FET M1 and NMOS FET M3 include gates coupled together, and configured to receive a first component of a voltage, which may be a differential bandgap voltage $kV_{bg}$ as illustrated, where k is the Boltzmann constant. The PMOS FET M1 and NMOS FET M3 include drains coupled together.

Additionally, the bias voltage generator 900 includes a PMOS FET M2 coupled in series with an NMOS FET M4 between the bias voltage rail $V_{bias1}$ and the lower voltage rail (e.g., ground). The PMOS FET M2 and NMOS FET M4 include gates coupled together, and configured to receive a second component of the voltage, which may be the differential bandgap voltage $kVb_g$ as illustrated. The PMOS FET M2 and NMOS FET M4 include drains coupled together.

The bias voltage generator 900 includes an NMOS FET M5 including a drain and gate configured to receive a bias current Ibias that may be related to a bandgap voltage $V_{bg}$ divided by a resistance of a resistor R ($Vb_g$/R) associated with an aforementioned filter. The NMOS FET M5 is coupled between the source of the bias current Ibias and the lower voltage rail (e.g., ground).

Additionally, the bias voltage generator 900 includes a PMOS FET M6, an NMOS FET M7, and NMOS FET M8 coupled in series between a first upper voltage rail Vdd1 and the lower voltage rail (e.g., ground). Further, the bias voltage generator 900 includes a PMOS FET M9, an NMOS FET M10, and NMOS FET M11 coupled in series between the first upper voltage rail Vdd1 and the lower voltage rail (e.g., ground). The PMOS FETs M6 and M9 include gates coupled together, and to the drain of PMOS FET M6. The NMOS FETs M7 and M10 include gates configured to receive a second bias voltage $V_{bias2}$. The NMOS FETs M7 and M10 also include sources coupled to the drains of NMOS FETs M3 and M4, respectively. The NMOS FETs M8 and M11 include gates coupled to the gate of NMOS FET M5.

Additionally, the bias voltage generator 900 includes an NMOS FET M12 coupled in series with an NMOS FET M13 between a second upper voltage rail Vdd2 and the lower voltage rail (e.g., ground). The first upper voltage rail Vdd1 may have a different supply voltage than the second upper voltage rail Vdd2. In some aspects, Vdd1 may be higher than Vdd2. For example, Vdd1 may be approximately 1.2V, while Vdd2 may be approximately 0.8V. Additionally, the bias voltage generator 900 includes an NMOS FET M14 coupled in series with an NMOS FET M15 between the second upper voltage rail Vdd2 and the lower voltage rail (e.g., ground). The NMOS FETs M12 and M14 include gates coupled to a drain of the PMOS FET M9. The NMOS FETs M13 and M15 include gates coupled to the gates of NMOS FETs M5, M8, and M11. The bias voltage $V_{bias1}$ associated with the $V_{bias1}$ voltage rail is generated at the source of NMOS FET M12, which is coupled to the sources of PMOS FETs M1 and M2.

The bias voltage generator 900 includes a first capacitor C1 connected between the drain of PMOS FET M9 and the lower voltage rail (e.g., ground). Further, the bias voltage generator 900 includes a second capacitor C2 coupled between a source of NMOS FET M14 and the lower voltage rail (e.g., ground). The supply voltage Vdd_inv is generated at the source of NMOS FET M14 (i.e., across the second capacitor C2). When the control loop of the bias voltage generator 900 settles, the bias voltage Vdd_inv adjusts the transconductance gain ($g_m$) of the inverter 910 inversely proportional to the resistance of the resistor associated with the filter with variation in process and/or temperature.

Figure 10:
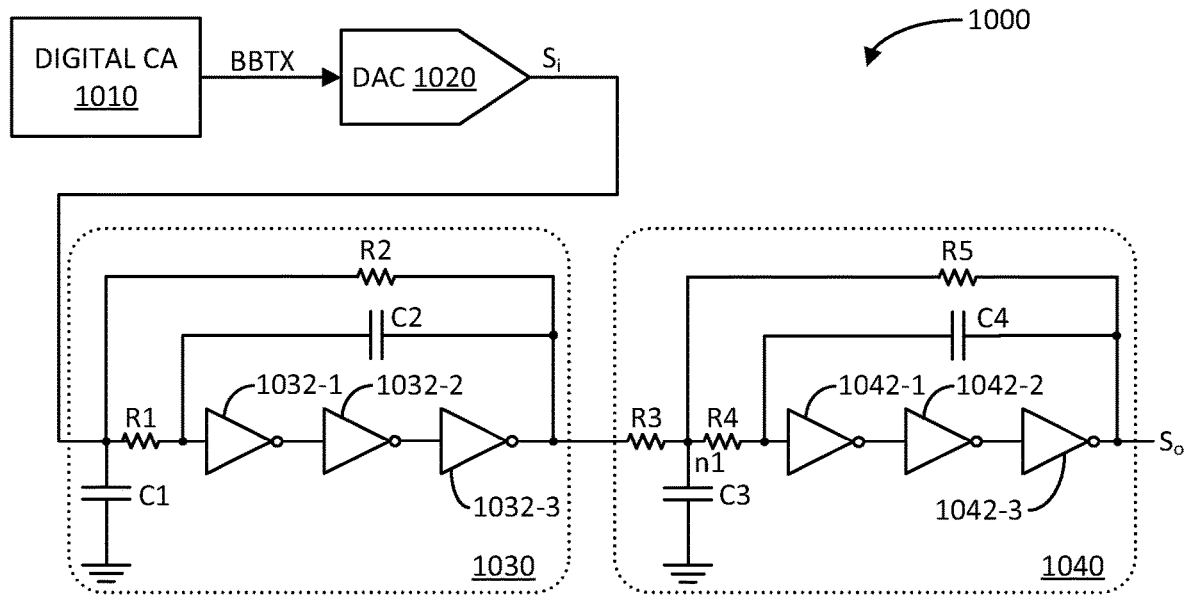
FIG. 10 illustrates a schematic diagram of an example transmitter in accordance with another aspect of the disclosure.

FIG. 10 illustrates a schematic diagram of an example transmitter 1000 in accordance with another aspect of the disclosure. Although the filters and/or gyrators discussed herein have been described with reference to receiver applications, as in the case of receiver 800, it shall be understood that that the filters and/or gyrators may also be used in a transmitter application. The transmitter 1000 is an example of one transmitter application employing filters as described herein.

More specifically, the transmitter 1000 includes a digital carrier aggregator (CA) 1010 configured to generate a digital baseband transmit signal (BBTX) and a digital-to-analog converter (DAC) 1020 configured to convert the digital baseband transmit signal BBTX into an analog baseband transmit signal $S_i$. It will be appreciated, however, that in other configurations the BBTX signal does not include a carrier aggregated signal and the source of the BBTX signal may include circuitry (e.g., in a modem of a mobile device) other than the digital CA 1010. The transmitter 1000 further includes a pair of cascaded filter stages 1030 and 1040 configured to filter the analog baseband transmit signal $S_i$ to remove signal images, noise and/or other unwanted signals to generate a filtered analog baseband transmit signal $S_o$. In a transmitter application, the filtered analog baseband transmit signal $S_o$ may be upconverted directly into a radio frequency (RF) signal or to an RF signal via an up-conversion into an intermediate frequency (IF) signal. Thus, the output of the filter stage 1040 may be coupled to a mixer (not illustrated) and the filter stage 1040 configured to provide the filtered analog baseband transmit signal $S_o$ to the mixer. In other embodiments, the filter stage 1040 is omitted and the filter stage 1030 is coupled to the mixer and configured to provide a filtered analog baseband signal to the mixer. In other embodiments, one or both of the first filter stage 1030 and the second filter stage 1040 may be replaced by a different type of filter (e.g., as described above, which may include a notch filter) and/or one or more additional filters may be coupled between the output of the second filter stage 1040 and the mixer.

The first stage filter 1030 may be configured as a Rauch filter, such as Rauch filter 200 previously described. The first stage filter 1030 includes an input capacitor C1, an input resistor R1, a set of cascaded inverters 1032-1 to 1032-3, a feedback capacitor C2, and a feedback resistor R2. The input capacitor C1 is connected between an input (node) of the first filter stage 1030 (where the signal $S_i$ is received) and a lower voltage rail (e.g., ground). The input resistor R1 is connected between the input (node) of the first filter stage 1030 and an input of the first cascaded inverter 1032-1. The feedback capacitor C2 is connected between an output of the last cascaded inverter 1032-3 and the input of the first cascaded inverter 1032-1. The feedback resistor R2 is connected between the output of the last cascaded inverter 1032-3 and the input (node) of the first filter stage 1030.

The second filter stage 1040 may also be configured as a Rauch filter, such as Rauch filter 200 previously described. The second stage filter 1040 includes a first input resistor R3, an input capacitor C3, a second input resistor R4, a set of cascaded inverters 1042-1 to 1042-3, a feedback capacitor C4, and a feedback resistor R5. The first input resistor R3 is coupled between an output of the first filter stage 1030 and node n1. The input capacitor C3 is connected between node n1 and the lower voltage rail (e.g., ground). The second input resistor R4 is connected between node n1 and an input of the first cascaded inverter 1042-1. The feedback capacitor C4 is connected between an output of the last cascaded inverter 1042-3 and the input of the first cascaded inverter 1042-1. The feedback resistor R5 is connected between the output of the last cascaded inverter 1042-3 and node n1. The output of the last cascaded inverter 1042-3 is configured to produce the filtered output signal $S_o$.

Figure 11:
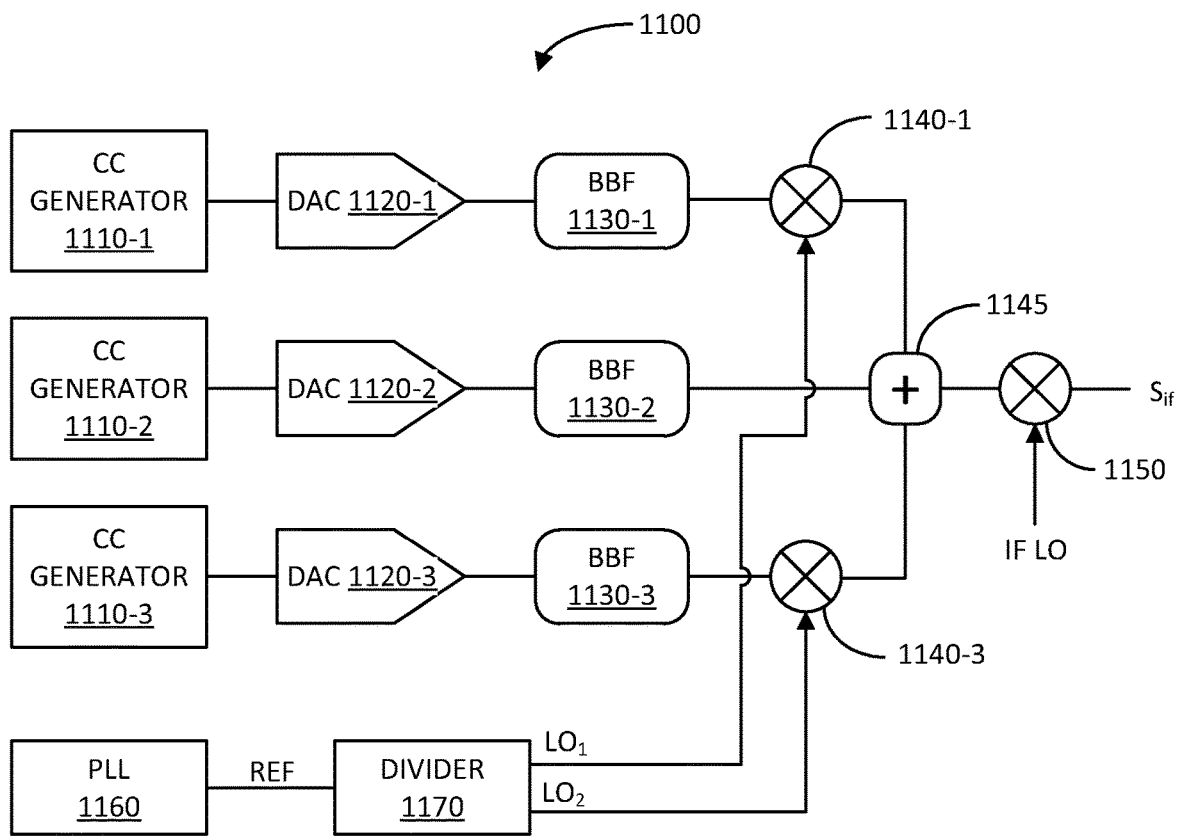
FIG. 11 illustrates a schematic diagram of another example transmitter in accordance with another aspect of the disclosure.

FIG. 11 illustrates a schematic diagram of another example transmitter 1100 in accordance with another aspect of the disclosure. The transmitter 1100 is another example where the filters described herein may be used to perform filtering of signals generated by digital-to-analog converters (DACs).

More specifically, the transmitter 1100 includes a first channel carrier component (CC) signal generator 1110-1, a first channel DAC 1120-1, a first channel baseband filter (BBF) 1130-1, and a first channel mixer 1140-1. The transmitter 1100 may further include a second channel carrier component (CC) signal generator 1110-2, a second channel DAC 1120-2, a second channel baseband filter (BBF) 1130-2, and an adder 1145. Additionally, the transmitter 1100 may further include a third channel carrier component (CC) signal generator 1110-3, a third channel DAC 1120-3, a third channel baseband filter (BBF) 1130-3, and a third channel mixer 1140-3. Any of the baseband filters (BBFs) 1130-1, 1130-2, and 1130-3 may be configured per any of the filters including a set of cascaded inverters described herein. In other embodiments, one or more of the BBFs 1130 are configured using an operational amplifier or otherwise without a set of cascaded inverters. Thus, while the transmitter 1100 may include filter(s) described herein that use a set of cascaded inverters, the transmitter 1100 is not limited to such configurations. In such other embodiments, the BBFs 1130 may use any other known configuration of a baseband filter.

The transmitter 1100 further includes a phase locked loop (PLL) 1160 configured to generate a reference oscillator signal REF, and a divider 1170 configured to generate local oscillator (LO) signals $LO_1$ and $LO_2$ based on the reference oscillator signal VREF (e.g., by dividing the frequency of the reference oscillator signal VREF). The divider 1170 includes outputs (at which the $LO_1$ and $LO_2$ signals are generated) coupled to inputs of mixers 1140-1 and 1140-3, respectively. The first mixer 1140-1 frequency converts the signal generated by the BBF 1130-1 based on the $LO_1$ signal. The second mixer 1140-3 frequency converts the signal generated by the BBF 1130-3 based on the $LO_2$ signal. The mixed signals from the mixer 1140-1 and 1140-3 are applied to inputs of the adder 1145, and the signal from the output of the BBF 1130-2 is also applied to another input of the adder 1145. The adder 1145 sums the signals from the mixers 1140-1 and 1140-3 and BBF 1130-2 to generate a carrier aggregated (CA) baseband signal. In some embodiments, the $LO_1$ and $LO_2$ signals have approximately equal frequency of opposite polarity centered around zero. For example, $LO_1$ and $LO_2$ may have a frequency of several hundred (e.g., 300-500, or around 400) MHz. The DACs 1120 may have an operating frequency which is greater than the frequency of the $LO_1$ and $LO_2$ signals (e.g., greater than 500 MHz, for example approximately 600 MHz). The BBFs 1130 may have a bandwidth which is less than the frequency of the $LO_1$ and $LO_2$ signals (e.g., less than 300 MHz, for example approximately 200 MHz).

The mixer 1150 includes a first input coupled to the output of the adder 1145 (where the CA baseband signal is produced), and a second input to receive an intermediate frequency LO. The mixer 1150 mixes the CA baseband signal with the IF LO to generate an IF signal $S_{if}$. In some embodiments, the IF LO signal has a frequency which is at least an order of magnitude greater than the frequency of the $LO_1$ and $LO_2$ signals. For example, the IF LO signal may have a frequency which is approximately 20 to 30 times the frequency of $LO_1$ and $LO_2$ signals. The IF signal $S_{if}$ may be subsequently filtered by, for example, any of the filters described herein or by another filter. The IF signal $S_{if}$ may further be upconverted to generate an RF signal for transmission.

Figure 12:
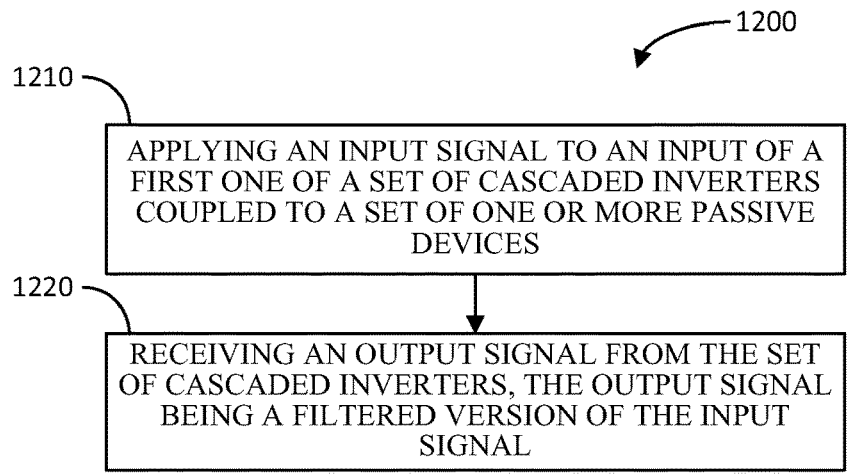
FIG. 12 illustrates a flowchart diagram of an example method of filtering a signal in accordance with another aspect of the disclosure.

FIG. 12 illustrates a flow diagram of an example method 1200 of filtering an input signal in accordance with another aspect of the disclosure. The method 1200 includes applying an input signal to an input of a first one of a set of cascaded inverters coupled to a set of one or more passive devices (block 1210); and outputting an output signal from the set of cascaded inverters, the output signal being a filtered version of the input signal (block 1220).

Figure 13:
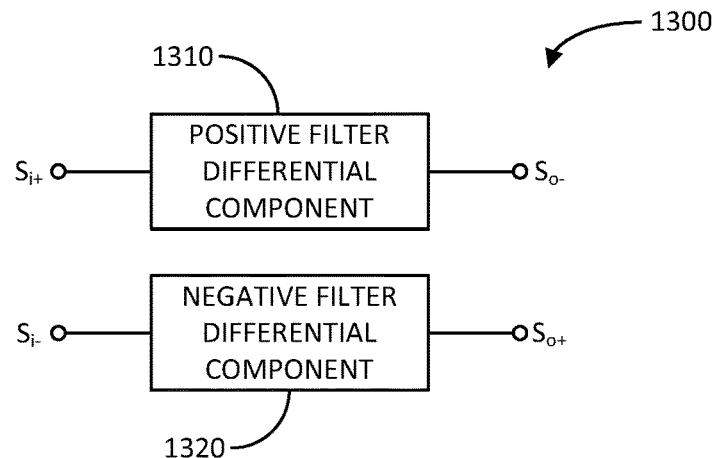
FIG. 13 illustrates a block diagram of an example pseudo-differential filter in accordance with another aspect of the disclosure.

FIG. 13 illustrates a block diagram of an example pseudo-differential filter 1300 in accordance with another aspect of the disclosure. The pseudo-differential filter 1300 includes a positive filter differential component 1310 and a negative filter differential component 1320. Each of the positive and negative filter differential components 1310 and 1320 may be configured per any of the filters previously discussed which include a set of cascaded inverters, such as filters 200, 300, 400, and 700. Both of the positive and negative filter differential components 1310 and 1320 may be configured the same, with substantially the same resistance(s) and capacitance(s) of the resistors and capacitors that make up the positive and negative filter differential components 1310 and 1320.

An input differential signal and $S_{i-}$ is applied to the inputs of the positive and negative filter differential components 1310 and 1320, respectively. The positive and negative filter differential components 1310 and 1320 are configured to filter the input differential signal and $S_{i+}$ and $S_{i-}$ to generate an output differential signal $S_{o-}$ and $S_{o+}$, respectively. The polarity between the input differential signal and the output differential signal may be reverse as most of the filters described herein employ negative feedback. However, the polarity may be the same for positive feedback filters, such as the Sallen-Key filter 400 previously discussed.

Figure 14:
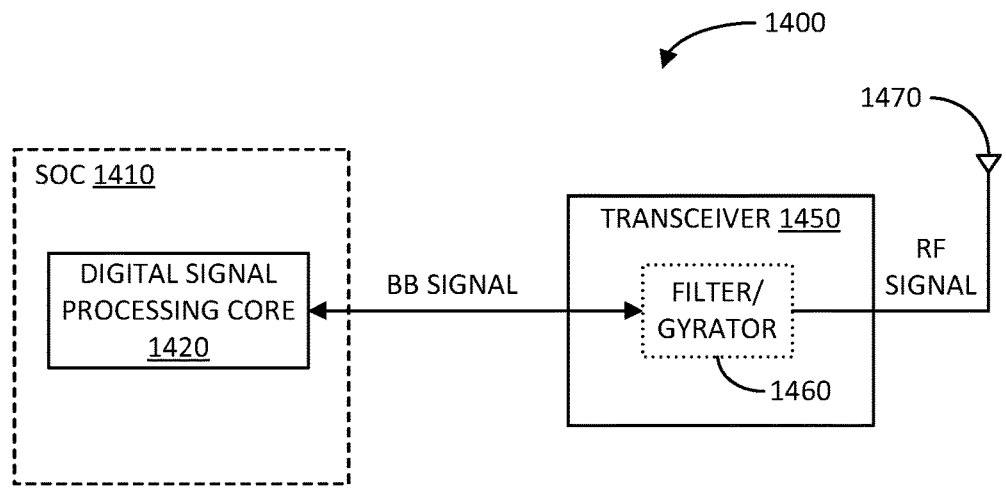
FIG. 14 illustrates a block diagram of an example wireless communication device in accordance with another aspect of the disclosure.

FIG. 14 illustrates a block diagram of an example wireless communication device 1400 in accordance with another aspect of the disclosure. Examples of the wireless communication device 1400 include cellular or mobile phones (e.g., smart phones), user terminals, personal computers, laptops, tablet devices, customer-premises equipment (CPE), smart watches and other personal wireless devices, wireless medical devices, vehicle (automotive) wireless devices, etc. The wireless communication device 1400 includes an integrated circuit (IC) 1410, which may be configured as a system on chip (SOC). The SOC 1410 may include a set of one or more digital signal processing cores 1420. The set of one or more digital signal processing cores 1420 may be configured to generate and/or process a baseband (BB) signal, for example that may be received from a filter having a set of cascaded inverters as described herein, or that may be provided to such filter.

The wireless communication device 1400 further includes a transceiver 1450, which may include a filter and/or gyrator 1460 having a set of cascaded inverters, as described herein. The filter and/or gyrator 1460 may be used (in conjunction with other circuitry) to convert the BB signal received from the SOC 1410 into a radio frequency (RF) signal to be applied to an antenna 1470 for transmission to one or more remote devices. Alternatively, the filter and/or gyrator 1460 may be used (in conjunction with other circuitry) to convert an RF signal received via the antenna 1470 into a BB signal to be applied to the SOC 1410 for further processing by the set of one or more digital signal processing cores 1420.

In some embodiments, the filter and/or gyrator 1460 may have a relatively wide bandwidth (e.g., several hundred MHz, such as 500-600 MHz or approximately 800 MHZ, or more), which may be beneficial when the transceiver 1450 operates with signals having a millimeter wave (mmW) frequency. In some such embodiments, channels at mmW frequencies may have a wider bandwidth as compared to channels established in older communication standards. These wide bandwidths may be realized in a low noise, low power, and/or high linearity configuration.

As a more specific receiver application example, wireless cellular networks, such as Long Term Evolution (LTE) and New Radio $5^{th}$ Generation (5G), include a channel B25, which extends from 1930 MHz to 1995 MHz for downlink operations. Accordingly, the baseband receive bandwidth is from −32.5 MHz to +32.5 MHz. An associated transmit signal may extend from 1850 MHz to 1915 MHz. To prevent leakage of the transmit signal to receiver baseband circuitry, a receiver baseband filter may be configured to have a stop band starting at 47.5 MHz below the low side of a passband for the B25 channel at baseband. For example, the filter 700 including the Rauch-configured second stage 720 and the notches produced by the capacitor-inductor shunt resonance (C1-L1, C2-L2, and C3-L3) may be configured to provide a desirable frequency response that accommodates the B25 channel passband and stop band. For example, the filter may be configured to place zeros to get greater than 20 dB stop band; thereby making the filtered signal at substantially the same level as in-band blocker signals.

The following provides an overview of aspects of the present disclosure:

Aspect 1: An apparatus, comprising a filter or a first gyrator comprising a first set of cascaded inverters; and a first set of one or more passive devices coupled to the first set of cascaded inverters.

Aspect 2: The apparatus of aspect 1, wherein the first set of one or more passive devices of the filter is connected between an input of a first one of the first set of cascaded inverters and an output of a second one of the first set of cascaded inverters.

Aspect 3: The apparatus of aspect 1 or 2, wherein a number of one or more cascaded inverter between the first one and the second one of the first set of cascaded inverters is an odd number.

Aspect 4: The apparatus of any one of aspects 1-3, wherein the first set of one or more passive devices comprises a capacitor.

Aspect 5: The apparatus of any one of aspects 1-4, wherein the first set of one or more passive devices comprises: a first resistor connected between an input of the filter and the input of the first one of the first set of cascaded inverters; and a second resistor connected between the input of the filter and the output of the second one of the first set of cascaded inverters.

Aspect 6: The apparatus of any one of aspects 1-5, wherein the filter is configured to provide a filter frequency response of a Rauch filter.

Aspect 7: The apparatus of aspect 1, wherein the filter comprises a first filter stage comprising the first set of cascaded inverters; and the first set of one or more passive devices coupled to the first set of cascaded inverters, wherein the first set of one or more passive devices comprises: a first resistor connected between an input of the first filter stage and an input of a first one of the first set of cascaded inverters; and a second resistor coupled in parallel with a first capacitor between the input of the first one of the first set of cascaded inverters and an output of a second one of the first set of cascaded inverters.

Aspect 8: The apparatus of aspect 7, wherein the filter further comprises a second filter stage comprising a second set of cascaded inverters; and a second set of one or more passive devices coupled to the second set of cascaded inverters, wherein the second set of one or more passive devices comprises: a third resistor connected between the output of the second one of the first set of cascaded inverters of the first filter stage and an input of a first one of the second set of cascaded inverters; and a second capacitor connected between the input of the first one of the second set of cascaded inverters and an output of a second one of the second set of cascaded inverters.

Aspect 9: The apparatus of aspect 7 or 8, wherein the filter further comprises a third filter stage comprising: a third set of cascaded inverters; and a third set of one or more passive devices coupled to the third set of cascaded inverters, wherein the third set of one or more passive devices comprises: a fourth resistor connected between the output of the second one of the second set of cascaded inverters of the second filter stage and an input of a first one of the third set of cascaded inverters; and a fifth resistor connected between the input of the first one of the third set of cascaded inverters and an output of a second one of the third set of cascaded inverters.

Aspect 10: The apparatus of aspect 9, further comprising a sixth resistor connected between the input of the first one of the first set of cascaded inverters of the first filter stage and the output of the second one of the third set of cascaded inverters of the third filter stage.

Aspect 11: The apparatus of aspect 9 or 10, wherein the first filter stage provides a band pass filter (BPF) frequency response, and wherein the first, second, and third filter stages collectively provide a low pass filter (LPF) frequency response.

Aspect 12: The apparatus of any one of aspects 7-11, wherein the filter is configured to provide a filter frequency response of a Tow-Thomas biquad filter.

Aspect 13: The apparatus of aspect 1, wherein the first set of one or more passive devices of the filter comprises: a first resistor connected between an input of the filter and a first node; a second resistor connected between the first node and an input of a first one of the first set of cascaded inverters; a first capacitor connected between the first node and a voltage rail; a second capacitor connected between the first node and an output of a second one of the first set of cascaded inverters; and third and fourth resistors connected in series between the output of the second one of the first set of cascaded inverters and the voltage rail, wherein a second node between the third and fourth resistors is coupled to an output of the first one of the first set of cascaded inverters.

Aspect 14: The apparatus of any one of aspects 1-13, wherein a number of the cascaded inverters between the first one and the second one of the first set of cascaded inverters is either zero (0) or an even number.

Aspect 15: The apparatus of aspect 1, 13 or 14, wherein the filter is configured to provide a filter frequency response of a Sallen-Key filter.

Aspect 16: The apparatus of aspect 1, wherein the first set of one or more passive devices of the first gyrator is connected between an output of a first one of the first set of cascaded inverters and a voltage rail, wherein the first gyrator further comprises an electrical-conductor connected between an input of the first one of the first set of cascaded inverters and an output of a second one of the first set of cascaded inverters.

Aspect 17: The apparatus of aspect 13 or 16, wherein the voltage rail comprises ground.

Aspect 18: The apparatus of any one of aspects 1, 10, 11 or 17, wherein the first set of one or more passive devices comprises a capacitor.

Aspect 19: The apparatus of any one of aspects 1-18, wherein the first set of one or more passive devices comprises a capacitor in series with a resistor.

Aspect 20: The apparatus of any one of aspects 1-10, wherein the filter comprises a first filter stage comprising the first gyrator connected between a node and a voltage rail.

Aspect 21: The apparatus of aspect 20, wherein the voltage rail comprises ground.

Aspect 22: The apparatus of any one of aspects 1-21, wherein the first gyrator comprises: the first set of cascaded inverters, wherein an input of a first one of the first set of cascaded inverters serves as the node; a first electrical-conductor connected between the input of the first one of the first set of cascaded inverters and an output of a second one of the first set of cascaded inverters; and the first set of one or more passive devices connected between an output of the first one of the first set of cascaded inverters and the voltage rail.

Aspect 23: The apparatus of any one of aspects 20-22, wherein the first filter stage further comprises a second gyrator connected between the node and the voltage rail.

Aspect 24: The apparatus of any one of aspects 20-23, wherein the second gyrator comprises: a second set of cascaded inverters, wherein an input of a first one of the second set of cascaded inverters serves as the node; a second electrical-conductor connected between the input of the first one of the second set of cascaded inverters and an output of a second one of the second set of cascaded inverters; and a second set of one or more passive devices connected between an output of the first one of the second set of cascaded inverters and the voltage rail.

Aspect 25: The apparatus of any one of aspects 20-24, wherein the first filter stage further comprises a third gyrator connected between the node and the voltage rail.

Aspect 26: The apparatus of any one of aspects 20-25, wherein the third gyrator comprises: a third set of cascaded inverters, wherein an input of a first one of the third set of cascaded inverters serves as the node; a third electrical-conductor connected between the input of the first one of the third set of cascaded inverters and an output of a second one of the third set of cascaded inverters; and a third set of one or more passive devices connected between an output of the first one of the third set of cascaded inverters and the voltage rail.

Aspect 27: The apparatus of any one of aspects 20-26, wherein the filter comprises a second filter stage comprises: the first set of cascaded inverters; and the first set of one or more passive devices, wherein the first set of one or more passive devices comprises: a first resistor connected between the node and the input of the first one of the first set of cascaded inverters; a second resistor connected between the node and the output of a second one of the first set of cascaded inverters; and a capacitor connected between the input of the first one of the first set of cascaded inverters and the output of the second one of the first set of cascaded inverters.

Aspect 28: The apparatus of any one of aspects 1-27, wherein the first set of one or more passive devices comprises a resistor, and further comprising a voltage generator configured to generate a supply voltage for the first set of cascaded inverters configured to vary a transconductance gain of the first set of cascaded inverters inversely with a resistance of the resistor in response to variation in process and/or temperature associated with the filter or the first gyrator.

Aspect 29: The apparatus of any one of aspects 1-28, wherein the filter comprises a positive filter differential component and a negative filter differential component, wherein the positive filter differential component comprises: the first set of cascaded inverters; and the first set of one or more passive devices coupled to the first set of cascaded inverters; and wherein the negative filter differential component comprises: a second set of cascaded inverters; and a second set of one or more passive devices coupled to the second set of cascaded inverters.

Aspect 30: The apparatus of any one of aspects 1-29, further including a mixer configured to mix a radio frequency (RF) signal with a local oscillator (LO) signal to generate a mixed signal, wherein the filter is configured to filter the mixed signal to generate an analog baseband signal; a by-passable in-band blocker configured to reduce unwanted signals from the analog baseband signal which lie within the passband of the received signal-of-interest; an analog-to-digital converter (ADC) configured to digitized the analog baseband signal or an analog signal generated by the in-band blocker; and a digital filter configured to filter the digital signal from the ADC to generate a baseband digital signal.

Aspect 31: The apparatus of any one of aspects 1-30, wherein the filter does not include an inductor or an operational amplifier.

Aspect 32: The apparatus of any one of aspects 1-31, wherein the filter consists of inverters, capacitors, and resistors.

Aspect 33: The apparatus of any one of aspects 1-32, wherein the filter is configured to filter analog baseband signals.

Aspect 34: The apparatus of any one of aspects 1-33, wherein a first inverter and a second inverter in the first set of cascaded inverters are directly connected together, and no other elements are connected therebetween or connected to a node therebetween Aspect 35: The apparatus of any one of aspects 1-34, wherein the first set of one or more passive devices comprises one or more reactance.

Aspect 36: A method, comprising: applying an input signal to an input of a first one of a set of cascaded inverters coupled to a set of one or more passive devices; and receiving an output signal from the set of cascaded inverters, the output signal being a filtered version of the input signal.

Aspect 37: A transceiver, comprising: a filter comprising: a first set of cascaded inverters; and a first set of one or more passive devices coupled to the first set of cascaded inverters; and a mixer coupled to the filter.

Aspect 38: The transceiver of aspect 37, further comprising: a first signal generator configured to generate a first digital signal; and a first digital-to-analog converter (DAC) configured to generate a first analog signal based on the first digital signal, wherein the first filter is configured to filter the first analog signal to generate a first filtered analog signal, and wherein the first mixer is configured to mix the first filtered analog signal with a first local oscillator (LO) signal to generate a first transmit signal.

Aspect 39: The transceiver of aspect 38, further comprising: a second filter comprising: a second set of cascaded inverters; and a second set of one or more passive devices coupled to the second set of cascaded inverters; and a second mixer coupled to the second filter; a second signal generator configured to generate a second digital signal; and a second digital-to-analog converter (DAC) configured to generate a second analog signal based on the second digital signal, wherein the second filter is configured to filter the second analog signal to generate a second filtered analog signal, and wherein the second mixer is configured to mix the second filtered analog signal with a second local oscillator (LO) signal to generate a second transmit signal.

Aspect 40: The transceiver of any one of aspects 37-39, further comprising: a third filter comprising: a third set of cascaded inverters; and a third set of one or more passive devices coupled to the third set of cascaded inverters; and a third signal generator configured to generate a third digital signal; a third digital-to-analog converter (DAC) configured to generate a third analog signal based on the third digital signal, wherein the third filter is configured to filter the third analog signal to generate a third transmit signal; and an adder to sum the first, second, and third transmits signal to generate a carrier-aggregated transmit signal.

Aspect 41: The transceiver of any one of aspects 37-40, further comprising a third mixer configured to mix the carrier aggregated transmit signal with a third local oscillator (LO) signal to generate an intermediate frequency (IF) or radio frequency (RF) transmit signal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
a filter configured to receive and filter an input signal to generate an output signal, the filter including a first filter stage and a second filter stage, the first filter stage comprising:
a first set of cascaded inverters;
a first set of one or more passive devices coupled to the first set of cascaded inverters, wherein the first set of one or more passive devices is connected between an output of a first one of the first set of cascaded inverters and a voltage rail; and
an electrical-conductor extending, in a feedback path, from an input of the first one of the first set of cascaded inverters to an output of a second one of the first set of cascaded inverters without any intervening components therebetween;
the second filter stage comprising:
a second set of one or more cascaded inverters; and
a second set of one or more passive devices connected between an input of a first one of the second set of cascaded inverters and an output of a second one of the second set of cascaded inverters; and
a signal generator, external to the filter, configured to generate and provide the input signal to the filter,
wherein an output of the first filter stage is coupled to an input of the second filter stage.

2. The apparatus of claim 1, wherein a number of one or more cascaded inverter between the first one and the second one of the first set of cascaded inverters is an odd number.

3. The apparatus of claim 1, wherein the first set of one or more passive devices comprises a capacitor.

4. The apparatus of claim 1, wherein the second set of one or more passive devices comprises:
a first resistor connected between the input of the second filter stage and the input of the first one of the second set of cascaded inverters; and
a second resistor connected between the input of the second filter stage and the output of the second one of the second set of cascaded inverters.

5. The apparatus of claim 1, wherein the second filter stage is configured to provide a filter frequency response of a Rauch filter.

6. The apparatus of claim 1, wherein the voltage rail comprises ground.

7. The apparatus of claim 1, wherein the first set of one or more passive devices comprises a capacitor, or wherein the first set of one or more passive devices comprises a capacitor in series with a resistor.

8. The apparatus of claim 1, wherein the first filter stage does not include an inductor or an operational amplifier.

9. The apparatus of claim 1, wherein the input signal comprises an analog baseband signal.

10. The apparatus of claim 1, wherein the filter is configured to get at least 20 decibel (dB) of rejection in a stop band.

11. The apparatus of claim 1, wherein the second set of one or more passive devices comprises:
a first resistor connected between the input of the second filter stage and the input of the first one of the second set of cascaded inverters;
a second resistor connected between the input of the second filter stage and the output of the second one of the second set of cascaded inverters; and
a capacitor connected between the input of the first one of the second set of cascaded inverters and the output of the second one of the second set of cascaded inverters.

12. An apparatus, comprising a first filter stage comprising a first gyrator connected between a node and a voltage rail, the first gyrator comprising:
a first set of cascaded inverters;
a first set of one or more passive devices coupled to the first set of cascaded inverters, wherein the first set of one or more passive devices is connected between an output of a first one of the first set of cascaded inverters and the voltage rail; and
an electrical-conductor extending, in a feedback path, from an input of the first one of the first set of cascaded inverters to an output of a second one of the first set of cascaded inverters without any intervening components therebetween,
wherein the first filter stage further comprises a second gyrator connected between the node and the voltage rail.

13. The apparatus of claim 12, wherein the voltage rail comprises ground.

14. The apparatus of claim 12, wherein the second gyrator comprises:
a second set of cascaded inverters;
a second electrical-conductor connected, in a feedback path, to an input of a first one of the second set of cascaded inverters and to an output of a second one of the second set of cascaded inverters; and
a second set of one or more passive devices connected between an output of the first one of the second set of cascaded inverters and the voltage rail.

15. The apparatus of claim 14, wherein the first filter stage further comprises a third gyrator connected between the node and the voltage rail.

16. The apparatus of claim 15, wherein the third gyrator comprises:
a third set of cascaded inverters;
a third electrical-conductor connected, in a feedback path, to an input of a first one of the third set of cascaded inverters and to an output of a second one of the third set of cascaded inverters; and
a third set of one or more passive devices connected between an output of the first one of the third set of cascaded inverters and the voltage rail.

17. The apparatus of claim 15, wherein the first filter stage comprises a capacitor coupled in series with the third gyrator between the node and the voltage rail.

18. The apparatus of claim 12, further comprising a second filter stage comprising:
a second set of cascaded inverters; and
a second set of one or more passive devices, wherein the second set of one or more passive devices comprises:
a first resistor connected between the node and an input of the first one of the second set of cascaded inverters;
a second resistor connected between the node and an output of a second one of the second set of cascaded inverters; and a capacitor connected between the input of the first one of the second set of cascaded inverters and the output of the second one of the second set of cascaded inverters.

19. The apparatus of claim 12, wherein the first filter stage comprises a capacitor coupled in series with the first gyrator between the node and the voltage rail.

20. The apparatus of claim 12, wherein the first filter stage comprises a capacitor coupled in series with the second gyrator between the node and the voltage rail.

21. The apparatus of claim 12, wherein the first set of one or more passive devices comprises a capacitor, or wherein the first set of one or more passive devices comprises a capacitor in series with a resistor.

22. The apparatus of claim 12, wherein the first filter stage does not include an inductor or an operational amplifier.

23. An apparatus, comprising a first filter stage comprising a first gyrator connected between a node and a voltage rail, the first gyrator comprising:
  a first set of cascaded inverters;
  a first set of one or more passive devices coupled to the first set of cascaded inverters, wherein the first set of one or more passive devices is connected between an output of a first one of the first set of cascaded inverters and the voltage rail; and
  an electrical-conductor extending, in a feedback path, from an input of the first one of the first set of cascaded inverters to an output of a second one of the first set of cascaded inverters without any intervening components therebetween,
  wherein the first filter stage comprises a capacitor coupled in series with the first gyrator between the node and the voltage rail.

24. The apparatus of claim 23, wherein the voltage rail comprises ground.

25. The apparatus of claim 23, wherein the first set of one or more passive devices comprises a capacitor, or wherein the first set of one or more passive devices comprises a capacitor in series with a resistor.

26. The apparatus of claim 23, wherein the first filter stage does not include an inductor or an operational amplifier.

* * * * *